United States Patent
Fukuda et al.

(10) Patent No.: US 9,570,327 B2
(45) Date of Patent: Feb. 14, 2017

(54) SUBSTRATE LIQUID TREATMENT APPARATUS AND SUBSTRATE LIQUID TREATMENT METHOD

(71) Applicant: TOKYO ELECTRON LIMITED, Tokyo (JP)

(72) Inventors: Masahiro Fukuda, Koshi (JP); Akihiro Kubo, Koshi (JP); Taro Yamamoto, Koshi (JP); Kenzi Yada, Koshi (JP); Atsushi Ookouchi, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 51 days.

(21) Appl. No.: 14/651,816

(22) PCT Filed: Dec. 12, 2013

(86) PCT No.: PCT/JP2013/083367
§ 371 (c)(1),
(2) Date: Jun. 12, 2015

(87) PCT Pub. No.: WO2014/092160
PCT Pub. Date: Jun. 19, 2014

(65) Prior Publication Data
US 2015/0318193 A1    Nov. 5, 2015

(30) Foreign Application Priority Data

Dec. 13, 2012    (JP) .................................. 2012-271880

(51) Int. Cl.
*B08B 5/02*    (2006.01)
*B08B 5/00*    (2006.01)
*H01L 21/67*    (2006.01)

(52) U.S. Cl.
CPC ............ *H01L 21/67051* (2013.01); *B08B 5/00* (2013.01); *B08B 5/02* (2013.01); *B08B 5/023* (2013.01);
(Continued)

(58) Field of Classification Search
CPC .............. B08B 3/02; B08B 3/022; B08B 5/00; B08B 5/02; B08B 5/023; B08B 2205/00; B08B 2205/005; H01L 21/67028; H01L 21/67034; D06G 1/00; F23J 3/02
See application file for complete search history.

(56) References Cited

U.S. PATENT DOCUMENTS

2007/0044823 A1\* 3/2007 Yamamoto ........ H01L 21/67051
134/33
2007/0137677 A1\* 6/2007 Nanba ............... H01L 21/02057
134/33

FOREIGN PATENT DOCUMENTS

JP    06-126264 A1    5/1994
JP    10-172944 A1    6/1998
(Continued)

OTHER PUBLICATIONS

International Search Report (Application No. PCT/JP2013/083367) dated Mar. 4, 2014.
(Continued)

*Primary Examiner* — Saeed T Chaudhry
(74) *Attorney, Agent, or Firm* — Burr & Brown, PLLC

(57)    ABSTRACT

A substrate liquid treatment apparatus comprises a chuck (13) that holds and rotates a wafer, a back surface purging nozzle (15) that discharges a purge gas toward the back surface of the wafer, and a periphery purging nozzle 16 that discharges the purge gas onto the back surface of the wafer. The back surface purging nozzle has a slit-like opening part extending from a central side to a peripheral side of the substrate in a plan view. Vertical distance between the
(Continued)

slit-like opening part and the substrate held by the substrate holding unit increases as approaching an end of the opening part on the central side of the substrate. The periphery purging nozzle discharges the purge gas, toward a central part of the substrate, toward a region on the back surface of the substrate, which region is located radially outside an end of the slit-like opening part of the back surface purging nozzle and radially inside an peripheral edge of the substrate.

16 Claims, 7 Drawing Sheets

(52) U.S. Cl.
CPC ... *H01L 21/67028* (2013.01); *H01L 21/67034* (2013.01)

(56) References Cited

FOREIGN PATENT DOCUMENTS

| JP | 2003-007669 A1 | 1/2003 |
|----|----------------|--------|
| JP | 2012-169572 A1 | 9/2012 |

OTHER PUBLICATIONS

English Translation of International Preliminary Report on Patentability (Chapter I) (Application No. PCT/JP2013/083367) dated Jun. 25, 2015.

\* cited by examiner (a)

(b)

ABSTRACT LIQUID TREATMENT APPARATUS AND SUBSTRATE LIQUID TREATMENT METHOD

TECHNICAL FIELD

The present invention relates to a substrate liquid treatment apparatus and a substrate liquid treatment method. In particular, the present invention relates to a technology for drying a cleaning liquid that was used in a back surface cleaning step for a substrate such as a glass substrate for a semiconductor wafer or a photomask, a glass substrate for a liquid crystal display device, a substrate for an optical disc, a substrate for bonding, and so forth (hereinafter collectively referred to simply as a "substrate"). Such a back surface cleaning process can be conducted together with various types of liquid treatment processes such as a coating film formation, a pattern development, a front/back surface brush cleaning and a chemical solution cleaning.

BACKGROUND ART

A photolithography process is conducted by using various types of liquid treatment units such as a coating unit for performing a film formation to a substrate by supplying a coating liquid to a surface of a substrate, a developing unit for performing a development treatment by supplying a developing solution to a surface of a substrate, and a cleaning unit for cleaning the front and back surfaces of a substrate before loading the substrate into an exposure apparatus. The liquid treatment processes performed by such treatment units include the back surface cleaning. The back surface cleaning is performed by discharging a cleaning liquid or pure water onto the substrate from a cleaning nozzle fixedly mounted to the treatment unit, while rotating the substrate with the substrate being held on a chuck by vacuum suctioning.

An example of the back surface cleaning will be explained below in connection with a cleaning unit shown in FIG. 10. The cleaning unit includes a cup 100 in which a wafer W is contained in a horizontal posture, a chuck 102 located at the center of the cup and driven for rotation by a motor M, cleaning nozzles 104a and 104b for discharging the cleaning liquid toward the back surface of the wafer W, and a supply nozzle 105 for supplying the cleaning liquid to the front surface of the wafer W. The back surface cleaning of the wafer W is carried out by supplying the cleaning liquid onto the back surface of the wafer W, when a treatment of the wafer W is being performed by supplying a treatment liquid to the front surface of the wafer W, or after completion the treatment. An example of the wafer back surface cleaning performed by using a similar configuration is described in JPH10-172944A (see FIG. 7 thereof, for example).

After such back surface cleaning, a considerable amount of cleaning liquid remains extensively adhering to the back surface of the substrate as a result of the discharging of the cleaning liquid onto the rotating substrate. Since the cleaning liquid adhering to the back surface of the substrate may cause adhesion of particles to the substrate and contamination of a transfer arm, the substrate should be dried before unloading the substrate from the cleaning unit. The drying of the substrate is performed by, for example, rotating the cleaned substrate at a high speed (e.g., 1500 rpm) and making the adhering cleaning liquid scatter around due to the centrifugal force (hereinafter referred to as "spin drying".

Problems with the conventional technology will be explained below by referring to FIGS. 1 and 2. With the progress of the miniaturization of the circuit patterns in recent years, the patterns are often formed up to a region close to the periphery of the wafer W (e.g., 1 mm inside the periphery) in order to obtain a greater number of devices from one substrate. FIG. 1 shows an example in which a coating film T has been formed on the surface of the wafer W, and a peripheral film removal in 1 mm width has been performed to the peripheral part S of the wafer W. The wafer W must have a notch part N. As shown in FIG. 2 magnifying a part X around the notch part N, the notch part N is a cutout having a length of 1 mm to 1.25 mm toward the inside of the wafer W and a width of 1 mm in the circumferential direction at the edge of the wafer W (upper edge of a bevel part B).

FIG. 2 shows the state of a region around the notch part N after performing the spin drying of the wafer W after the back surface cleaning. Part of the film within 1 mm from the edge of the wafer W has been removed by a previous liquid treatment. The left-hand side of the notch part N is in fine condition. The cross-hatched region C above the dotted line A on the right-hand side of the notch part N is defective. The cross-hatched region C is located in the device region of the wafer W and a defect existing in the device region can adversely affect the device patterns formed on the wafer W.

The cross-hatched region C corresponds to traces (water marks) of the cleaning liquid (adhering to the back surface of the wafer W in the wafer back surface cleaning) penetrating into the front surface of the wafer W via the notch part N in the spin drying. Such penetration of the cleaning liquid into the front surface occurs due to change in the behavior of the cleaning liquid caused by the notch part N when the cleaning liquid adhering to the back surface of the wafer W is thrown off by the centrifugal force. Specifically, the cleaning liquid is captured within the thickness of the wafer W in the V-shaped valley part of the notch N. The captured cleaning liquid swells up due to surface tension and part of the swollen cleaning liquid breaks away and penetrates into the front surface of the wafer W. The cleaning liquid penetrating into the front surface of the wafer W and forming a ball is immediately thrown off by the centrifugal force. Since the wafer W is rotating, such a ball-shaped cleaning liquid develops exclusively in a region ahead of the notch part N in regard to the wafer rotation direction, the defective cross-hatched region C develops in a style like the one shown in FIG. 2.

In order to suppress such defects specific to the cleaning liquid drying step, a drying step recipe for changing the revolution speed of the spin drying with time is set. For example, the majority of the cleaning liquid adhering to the back surface is removed first by rotating the wafer W at a low revolution speed around 400 rpm. Subsequently, the revolution speed is successively shifted to a middle revolution speed around 1000 rpm and a high revolution speed around 1500 rpm and the drying is gradually advanced in multiple stages. With this drying step recipe, the gathering and swelling of the cleaning liquid in the notch part N can be suppressed. However, setting the drying step recipe in multiple stages leads to extension of the processing time and that adversely affects the productivity.

SUMMARY OF THE INVENTION

The object of the present invention is to provide a technology that makes it possible to perform the drying excellently without causing a defect in the vicinity of the notch part N on the back surface of the substrate and without the need of extending the processing time.

In a preferred embodiment of to the present invention, a substrate liquid treatment apparatus which performs a cleaning treatment by supplying a cleaning liquid to a back surface of a substrate is provided. The substrate liquid treatment apparatus includes: a substrate holding unit that horizontally holds the substrate at a central part of the back surface of the substrate; a rotary drive mechanism that rotates the substrate holding unit around a vertical axis; a back surface purging nozzle that discharges a purge gas onto the back surface of the substrate that is rotating while being held by the substrate holding unit; a periphery purging nozzle that discharges the purge gas onto the back surface of the substrate that is rotating while being held by the substrate holding unit; a purge gas supplying mechanism that supplies the purge gas to the back surface purging nozzle and the periphery purging nozzle; and a control unit that controls the rotary drive mechanism and the purge gas supplying mechanism, wherein the back surface purging nozzle has a slit-like opening part extending from a central side to a peripheral side of the substrate in a plan view, and wherein vertical distance between the slit-like opening part and the substrate held by the substrate holding unit increases as approaching an end of the slit-like opening part on the central side of the substrate, wherein the periphery purging nozzle is installed such that the periphery purging nozzle discharges the purge gas toward a region on the back surface of the substrate, which region is located radially outside an end of the slit-like opening part of the back surface purging nozzle and radially inside an peripheral edge of the substrate, and such that the purge gas is directed toward a central part of the substrate, and wherein the control unit controls the rotary drive mechanism and the purge gas supplying mechanism such that, after supplying of the cleaning liquid to the substrate is stopped, the back surface purging nozzle and the periphery purging nozzle discharge the purge gas toward the back surface of the substrate while rotating the substrate having the cleaning liquid adhering thereto.

Here, the "slit-like opening part" means an opening part in any form capable of discharging a gas in a shape like a strip or band (planar shape). The form of the slit-like opening part may be a single long and narrow hole, a plurality of small-diameter circular holes arranged at regular intervals on a straight line, and so forth.

In order to gather the cleaning liquid adhering to the back surface of the substrate into liquid drops by using the gas discharged from the slit-like opening part onto the back surface of the substrate, it is preferable that the length of the slit-like opening part is at least ¼ of the radius of the substrate.

It is preferable that the revolution speed of the substrate is from 3 rpm to 30 rpm for the following reasons: If the revolution speed of the substrate is lower than 3 rpm, the drying takes a long time. If the revolution speed is higher than 30 rpm, the transformation of the cleaning liquid into liquid drops and the falling of the liquid drops from the substrate are delayed by the effect of the centrifugal force acting on the cleaning liquid, and thus the drying takes a long time also in this case.

With the above features, the substrate can be dried without using the method rotating the substrate at a high revolution speed and thereby spinning off the cleaning liquid, in a case where the substrate is to be dried after a cleaning process for washing contaminants away from the back surface of the substrate, which cleaning process is performed concurrently with of after performing a variety of liquid treatment on the substrate or a cleaning process using a brush. For example, by discharging the purge gas from the back surface purging nozzle and the substrate periphery purging nozzle arranged toward the back surface of the substrate while rotating the substrate at a low revolution speed of 3 rpm to 30 rpm or less at which the centrifugal force is small, it is possible to cause the cleaning liquid on the back surface of the substrate to gather around the end of the back surface purging nozzle on the central side of the substrate, transform into liquid drops, and fall from the substrate. Accordingly, the cleaning liquid adhering to the back surface of the substrate is successively transformed into liquid drops. Thus, in combination with the drying effect of the purge gas discharging itself, the substrate can be dried in a short time and the occurrence of the defect caused by the wandering of the cleaning liquid into the front surface of the substrate via the notch part of the substrate can be prevented.

Preferably, the end of the slit-like opening part of the back surface purging nozzle on the peripheral side of the substrate is located on a straight line extending in a radial direction of the substrate held by the substrate holding unit in a plan view, and the end of the slit-like opening part on the central side of the substrate is located on the straight line extending in the radial direction or at a position advanced in a rotation direction of the substrate from the straight line extending in the radial direction. In the latter case, it is also preferable to set the slit-like opening part at an angle of approximately 30 degrees with respect to the straight line extending in the radial direction. Preferably, the back surface purging nozzle is arranged to discharge the purge gas so that the purge gas is incident obliquely on the back surface of the substrate in a direction against the rotation direction of the substrate.

If the purge gas discharge direction of the back surface purging nozzle is set in opposition to (against) the rotation direction of the substrate, the cleaning liquid adhering to the back surface is facilitated to grow in thickness and fall from the substrate in the form of liquid drops. If the end of the slit-like opening part on the central side of the substrate is located at a position advanced in the rotation direction of the substrate from the straight line extending in the radial direction, the cleaning liquid adhering to the back surface is facilitated to gather around the center of the substrate and fall from the substrate in the form of liquid drops.

Preferably, the vertical distance between the slit-like opening part and the substrate measured at the end of the slit-like opening part on the central side of the substrate is approximately twice the vertical distance measured at the end of the slit-like opening part on the peripheral side of the substrate.

The vertical distance between the slit-like opening part and the substrate is set so as to increase as approaching the end of the slit-like opening part on the central side of the substrate. With such a change in the distance, the purge gas hits the back surface with high pressure on the long distance side (large clearance side) and with low pressure on the short distance side (small clearance side). Accordingly, the cleaning liquid on the back surface gathers on the low pressure side (central side of the substrate) and thereby smoothly transforms into liquid drops.

Preferably, the periphery purging nozzle has a slit-like opening part extending in a tangential direction of the periphery of the substrate. Preferably, the purge gas hitting position of the substrate periphery purging nozzle is spaced radially inwardly apart from the peripheral edge of the substrate at a distance within a range of from 2 mm to 10 mm.

By forming the substrate periphery purging nozzle as a slit nozzle as above, the cleaning liquid can be surely pushed toward the central side of the substrate.

The back surface purging nozzle may be configured to discharge a gas orthogonally onto a straight line extending on the back surface in a radial direction of the substrate.

In this case, the cleaning liquid that has been pushed toward the central side of the substrate by the purge gas discharged from the substrate periphery purging nozzle grows in thickness while being pushed in a direction opposing the rotation direction by the purge gas discharged from the back surface purging nozzle orthogonally onto the straight line extending on the back surface in the radial direction of the substrate, transforms into liquid drops, and falls from the substrate.

Preferably, the substrate liquid treatment apparatus a tubular member surrounding the substrate holding unit, wherein the tubular member is arranged such that a small clearance is formed between an upper end of the tubular member and the back surface of the substrate held by the substrate holding unit. In this case, preferably, the tubular member has a tip end (top) facing the substrate, an inclined surface extending obliquely downward from the tip end so as to lower toward outside, and gas discharging ports formed along the circumference of the inclined surface for discharging a gas onto the back surface of the substrate.

With such a tubular member, adhesion of the cleaning liquid to the substrate holding unit and resultant contamination of the substrate holding unit are prevented even if the cleaning liquid is pushed toward the central side of the substrate by the force of the purge gas discharged from the substrate periphery purging nozzle. Further, contamination of the tubular member itself can also be prevented since the purge gas is discharged from the vicinity of the tip end of the tubular member toward the back surface of the substrate.

In another preferred embodiment, the present invention provides a substrate liquid treatment method that performs a liquid treatment that treats a surface of a substrate by supplying a treatment liquid to the surface or a brush cleaning treatment that cleans a substrate with a brush and also performs a cleaning treatment that cleans a back surface of a substrate by supplying a cleaning liquid to the back surface. The substrate liquid treatment method includes: rotating the substrate by means of a substrate holding unit holding the substrate at a central part of the back surface of the substrate, with the supplying of the cleaning liquid to the back surface being stopped and with the cleaning liquid adhering to the back surface; and performing back surface purging by discharging from a back surface purging nozzle a purge gas toward the back surface of the substrate and by discharging a purge gas from a periphery purging nozzle toward the back surface of the substrate, wherein the back surface purging nozzle has a slit-like opening part extending from a central side to a peripheral side of the substrate in a plan view, and wherein vertical distance between the slit-like opening part and the substrate held by the substrate holding unit increases as approaching an end of the slit-like opening part on the central side of the substrate, wherein the periphery purging nozzle discharges the purge gas toward a region on the back surface of the substrate, which region is located radially outside an end of the slit-like opening part of the back surface purging nozzle and radially inside an peripheral edge of the substrate, such that the purge gas is directed toward a central part of the substrate, and the back surface purging and the substrate periphery purging are started after the supplying of the cleaning liquid is stopped.

According to the present invention, the purge gas is discharged onto the peripheral part of the back surface of the substrate toward the center of the substrate when the substrate is rotated at a low revolution speed at which the centrifugal force is small. Therefore, the amount of the cleaning liquid reaching the notch part can be reduced and the penetration of the cleaning liquid into the front surface of the substrate can be prevented. Further, the cleaning liquid is gathered in a region on the back surface purging nozzle's side by the cooperation of the periphery purging nozzle and the back surface purging nozzle, by which the cleaning liquid is transformed into liquid drops and falls from the substrate. Furthermore, since the drying of the back surface by the purge gas is promoted, the drying time can be shortened. Therefore, two objectives, i.e., the shortening of the treatment time and the prevention of defects caused by the penetration of the cleaning liquid into the front surface of the substrate, can be achieved at the same time.

EMBODIMENTS FOR CARRYING OUT THE INVENTION

The substrate liquid treatment apparatus in one embodiment of the present invention may be configured to perform a prescribed liquid treatment to a substrate by supplying a treatment liquid (e.g., cleaning liquid for cleaning a wafer, resist solution for forming a resist film, anti-reflection film forming liquid, developing solution for developing patterns after the exposure, etc.) to the front surface of the substrate.

The substrate liquid treatment apparatus comprises a configuration for cleaning the back surface of the substrate in order to prevent the treatment liquid used for the liquid treatment from remaining on the back surface of the wafer, or to prevent generation of particles from the remaining treatment liquid. The embodiment described below relates to a configuration for preventing the occurrence of a defect (defective part) in a region on the substrate's front surface in the vicinity of the notch part after the substrate back surface cleaning, and for drying the substrate with high efficiency. The following explanation will be made for a case where the substrate liquid treatment apparatus is a cleaning unit for cleaning the front surface of a wafer (substrate) and such a cleaning unit is provided with functions of cleaning and drying the back surface of the substrate.

Figure 1:
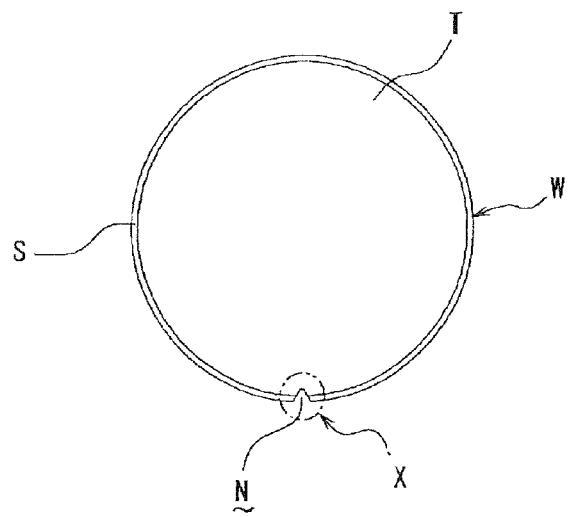
FIG. 1 is a plan view of a substrate treated by a substrate liquid treatment method.

As shown in FIG. 1, a cleaning unit 1 includes a cup 11 as a bottomed annular treatment vessel having an opening at the top. Arranged at the center of the inside of the cup 11 is chuck 13 as a unit for holding the wafer W. The chuck 13 holds the wafer W horizontally by suctioning the central part of the wafer W, and rotates the wafer W. The cleaning treatment for the wafer W is performed by discharging by a front surface cleaning nozzle 10 the cleaning liquid onto the wafer W from a position directly above the center of the wafer W, while rotating the wafer W using a motor M as a rotary drive mechanism for the chuck 13. The front surface cleaning nozzle 10 is connected to a cleaning liquid supply source E via a front surface cleaning liquid supplying tube 21 having a cleaning liquid on/off valve V1 therein. The cleaning liquid (e.g., pure water, alkaline aqueous solution or acidic aqueous solution) supplied from the cleaning liquid supply source E is discharged from the front surface cleaning nozzle 10. The rotation of the rotary drive motor M is controlled by a control unit H.

The opening and closing of the cleaning liquid on/off valve V1 is controlled by the control unit H so that the front surface cleaning nozzle 10 discharges the cleaning liquid at prescribed timing in a cleaning treatment step. The cup 11 receives the cleaning liquid supplied to the wafer W and scattering from the wafer W due to the rotation of the wafer W. The cleaning liquid is collected in a bottom part of the cup 11 and thereafter discharged through a liquid waste tube (not shown). A cup base 12 is provided in the bottom part of the cup 11. The chuck 13 is located at the center of the cup base 12.

The chuck 13 is surrounded with a tubular member 17 having an inner diameter several millimeters larger than the diameter of the chuck 13. The clearance between the upper end of the tubular member 17 and the wafer W held by the chuck 13 by suctioning is 1 mm, for example. The diameter of the chuck 13 is 50 mm, for example, in an apparatus for processing 12-inch wafers, and 70 mm, for example, in an apparatus for processing 18-inch wafers. The tubular member 17 has an inclined surface (whose inclination angle is 45 degrees, for example) at its upper end. Gas discharging ports 17a for discharging a purge gas toward the back surface of the wafer W in directions orthogonal to the inclined surface are formed along the circumference of the tubular member 17.

The tubular member 17 is connected to a purge gas supply source G via a tubular member gas supplying tube 27 having a gas on/off valve V5 therein and a purge gas main tube 24. A gas (e.g., dry air or $N_2$ (nitrogen) gas) to be used as the purge gas is supplied from the purge gas supply source G to the tubular member 17 and discharged from the gas discharging ports 17a. The opening and closing of the gas on/off valve V5 for the tubular member is controlled by the control unit H so that the gas discharging ports 17a discharge the purge gas at prescribed timing in the cleaning treatment step.

Two back surface cleaning nozzles 19a and 19b for cleaning the back surface of the wafer W by discharging the cleaning liquid (e.g. pure water) toward the back surface of the rotating wafer W are arranged between the outer surface of the tubular member 17 and the peripheral edge of the wafer W. The back surface cleaning nozzles 19a and 19b are connected to a pure water supply source F via pure water supplying tubes 23 and a pure water main tube 22 having a pure water on/off valve V2 therein. Pure water (cleaning liquid) supplied from the pure water supply source F can be discharged from the back surface cleaning nozzles 19a and 19b. The pure water on/off valve V2 is controlled by the control unit H so that the back surface cleaning nozzles 19a and 19b discharge the cleaning liquid (pure water) at prescribed timing in the cleaning treatment step.

Three transfer support pins 14 in charge of transferring the wafer W between the cup base 12 and a transfer arm (not shown) for transferring the wafer W to the cleaning unit 1 are arranged on the cup base 12 at positions around the center of the wafer W at 120-degree angular intervals. These transfer support pins 14 are supported by a common base bracket (not shown). By raising and lowering the base bracket, the transfer support pins 14 can be raised and lowered between a height position higher than the opening of the cup 11 and a height position lower than the chuck 13.

Here, the loading and unloading of the wafer W into/from the cleaning unit 1 will be explained. For the loading, the transfer support pins 14 stands-by at a height position higher than the opening of the cup 11, and the transfer arm holding the wafer W places the wafer W on the transfer support pins 14. Subsequently, the transfer support pins 14 are lowered. During the lowering of the transfer support pins 14, the wafer W is transferred to the chuck 13 and held by the chuck 13 by suctioning. For the unloading, the suction by the chuck 13 is canceled and the transfer support pins 14 during rising receive the wafer W and rises further. Thereafter, wafer W is received by the transfer arm at a height position higher than the opening of the cup 11. The timing of these actions is controlled by the control unit H.

Figure 3:
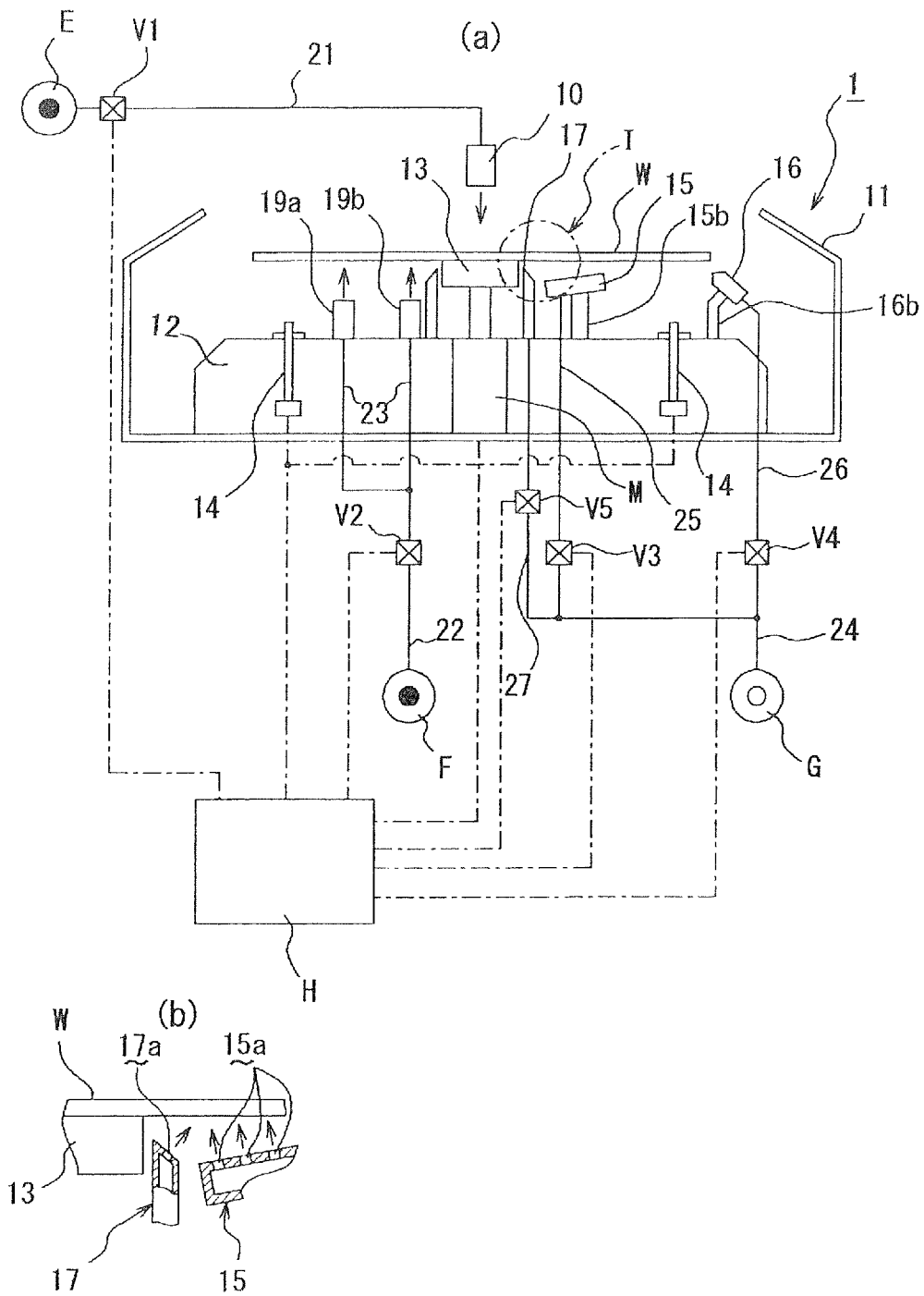
FIG. 3 is a schematic diagram showing a cleaning unit of a substrate liquid treatment apparatus in one embodiment of the present invention, wherein (a) is a schematic vertical sectional view, and (b) is an enlarged sectional view of the part I in (a).

Next, a back surface purging nozzle 15 and a substrate periphery purging nozzle 16 (hereinafter abbreviated as a "periphery purging nozzle 16") in the present invention will be explained in detail with reference to FIGS. 3 to 7. The outline will be explained first with reference to FIG. 3 and thereafter the details will be explained with reference to FIGS. 4 to 7 (plan view and vertical sectional views). As shown in FIG. 3, the periphery purging nozzle 16 is mounted on the cup base 12 via a mount bracket 16b in the vicinity of the peripheral edge of the wafer W held by the chuck 13. The position where the purge gas discharged from the periphery purging nozzle 16 hits the wafer W is set at a position avoiding the notch part N of the wafer W. The position where the purge gas hits the wafer W will be explained later.

The back surface purging nozzle 15 is mounted on the cup base 12 via a mount bracket 15b in the vicinity of the outer surface of the tubular member 17. The back surface purging nozzle 15 has a slit-like opening part 15a having a certain length measured in the radial direction of the wafer W. For example, the slit-like opening part 15a (see FIGS. 5 and 6) has a length between ⅓ and ½ of the radius of the wafer W and a width between 0.5 mm and 1 mm, and is capable of discharging the purge gas at a discharging rate of 20 to 60 L/min. The slit-like opening part 15a may also be formed by arranging a plurality of ϕ0.5 mm circular holes at 1 mm intervals over the aforementioned length, for example.

Also in this case, the same type of purge gas flow can be achieved. Therefore, the term "slit-like opening part" in this specification is not restricted to a single long and narrow opening but means an opening part (discharging part) in any form capable of discharging (blowing out) the purge gas in a shape like a strip or band (planar shape) similarly to the single long and narrow opening.

While the length of the slit-like opening part 15a is from ⅓ to ½ of the radius of the wafer W in the above explanation, the length of the slit-like opening part 15a of not smaller than ¼ of the radius of the wafer W is sufficient to ensure gathering of the cleaning liquid adhering to the back surface of the wafer W into liquid drops by use of the gas discharged from the slit-like opening part 15a onto the back surface of the wafer W.

Specifically, when the slit-like opening part 15a is arranged at an inclination angle θ (explained later) in a plan view with respect to a straight line extending in the radial direction of the wafer W, for the purpose of gathering the cleaning liquid adhering to the back surface of the wafer W into liquid drops, a 450-mm wafer W (i.e., wafer W of a 225 mm radius) requires the length of the opening part 15a to be at least approximately 44 mm (¼ of the radial-direction length 175 mm of the exposed part of the wafer W) assuming that the radius of the chuck 13 is approximately 50 mm. A 300-mm wafer W (i.e., wafer W of a 150 mm radius) requires the length of the opening part 15a to be at least approximately 30 mm (¼ of the radial-direction length 120 mm of the exposed part of the wafer W) assuming that the chuck radius is approximately 30 mm. If the length of the slit-like opening part 15a is too short, the gathering of the cleaning liquid becomes difficult.

The back surface purging nozzle 15 and the periphery purging nozzle 16 are supplied with the purge gas (e.g., dry air of $N_2$ gas) from the purge gas supply source G. The back surface purging nozzle 15 is connected to the purge gas supply source G via a back surface purge gas supplying tube 25 having a back surface purge gas on/off valve V3 therein and the purge gas main tube 24 so as to discharge the purge gas supplied from the purge gas supply source G in a strip-like shape. On the other hand, the periphery purging nozzle 16 is connected to the purge gas supply source G via a periphery purge gas supplying tube 26 having a periphery purge gas on/off valve V4 therein and the purge gas main tube 24 so as to discharge the purge gas supplied from the purge gas supply source G. The opening/closing timing of the back surface purge gas on/off valve V3 and the periphery purge gas on/off valve V4 is controlled by the control unit H.

Next, the positional relationship between the back surface purging nozzle 15 and the periphery purging nozzle 16 will be explained by referring to the plan view of FIG. 4. The back surface purging nozzle 15 and the periphery purging nozzle 16 are arranged at angular positions (determined based on the wafer W) 90 degrees apart from each other, for example.

The setting of the installation position of the back surface purging nozzle 15 will be explained below. First, the back surface purging nozzle 15 is arranged such that its slit-like opening part 15a extends in the radial direction of the wafer W in a plan view. Ends of the slit-like opening part 15a positioned radially inside and outside, will hereinafter be referred to as an "inner end Y" and an "outer end Z", respectively. In this case, the slit-like opening part 15a is arranged so as to discharge the purge gas in a direction against the rotation direction of the wafer W in a plan view.

From this state, the inner end Y is rotated around the outer end Z (rotation center) by an angle θ within a range from 0 to 45 degrees, by which the inner end Y is moved to a position that is advanced in the rotation direction of the wafer W from the straight line passing through the outer end Z and extending in the radial direction. The angle θ is 30 degrees in FIG. 4, for example. By appropriately setting the angle θ (e.g., 30 degrees), inward movement of the cleaning liquid (on the back surface of the wafer) pushed by the purge gas toward the central side of the wafer W is promoted. Further, the gathering of the cleaning liquid is promoted by discharging from the slit-like opening part 15a the purge gas in a direction against the rotation direction of the wafer W.

In order to prevent the cleaning liquid (being pushed toward the central side of the wafer W) from entering a region inside the tubular member 17 in regard to the radial direction (i.e., entering the region on the side of the chuck 13) due to the force of the gas discharged from the back surface purging nozzle 15, it is desirable to secure an appropriate interval (e.g., approximately 5 mm to 10 mm) between the inner end Y of the back surface purging nozzle 15 and the tubular member 17. Further, from the gas discharging ports 17a of the tubular member 17, the purge gas is discharged radially outward and obliquely upward, toward the back surface of the wafer W. This prevents the cleaning liquid (being pushed toward the central side of the wafer W by the purge gas discharged from the back surface purging nozzle 15) from entering the region on the side of the chuck 13. Further, by the purge gas discharged from the gas discharging ports 17a of the tubular member 17, the cleaning liquid can be gathered in a region on the wafer's back surface between the tubular member 17 and the inner end Y.

Figure 5:
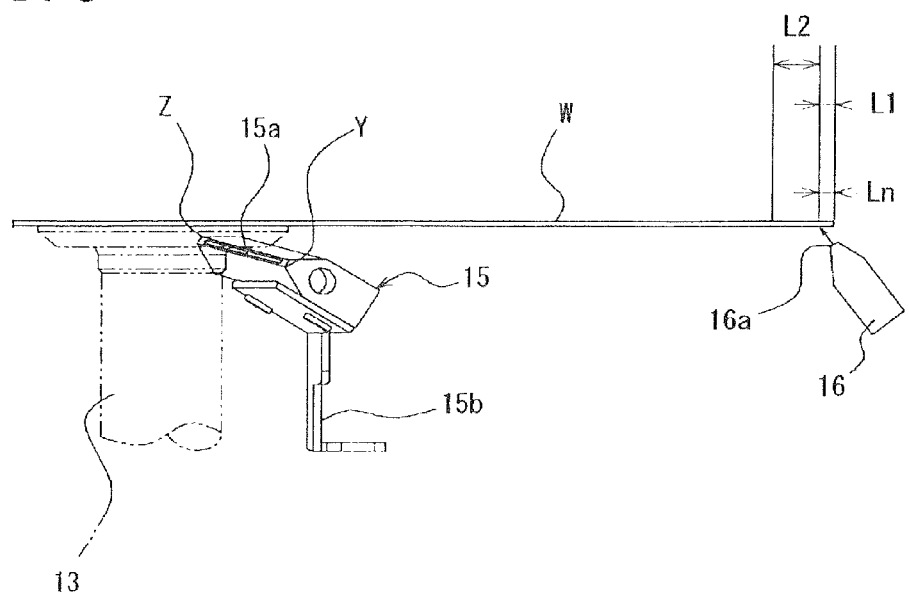
FIG. 5 is a side view of the back surface purging nozzle and the substrate periphery purging nozzle viewed in the direction of the arrow II in FIG. 4.

The periphery purging nozzle 16 may be configured to blow the purge gas onto a circular spot surface. Preferably, the periphery purging nozzle 16 may be configured similarly to the back surface purging nozzle 15 (with a slit-like opening part) and the purge gas discharge rate of the periphery purging nozzle 16 can also be set equivalent to that of the back surface purging nozzle 15, for example. The slit-like opening part 16a of the periphery purging nozzle 16 extends in the tangential direction of the periphery of the wafer W in a plan view. In other words, the slit-like opening part 16a is directed toward the center of the wafer W. As shown in FIG. 5, the periphery purging nozzle 16 is arranged such that the purge gas is discharged from the slit-like opening part 16a obliquely upward toward the back surface of the wafer W at a discharge angle (elevation angle) of 30 degrees, for example. With this arrangement, the cleaning liquid flowing toward the periphery of the wafer W due to the centrifugal force is pushed back toward the central side of the wafer W.

The purge gas hitting position of the periphery purging nozzle 16 may be set more inside than the set area Ln of the notch part N (i.e., between a position a distance L1(=3 mm) apart from the periphery of the wafer inward in the radial direction and a position a distance L2(=10 mm) apart from the former position inward in the radial direction). Preferably, the purge gas hitting position of the periphery purging nozzle 16 is set at a position 5 mm apart inwardly from the edge of the wafer W. By this setting, the amount of the cleaning liquid accumulated in the notch part N can be minimized, by which the penetration of the cleaning liquid into the front surface of the wafer W can be prevented.

Next, the arrangement of the back surface purging nozzle 15 will be explained in more detail by referring to FIGS. 5, 6 and 7 viewing the back surface purging nozzle 15 and the periphery purging nozzle 16 in the directions of the arrows II, III and IV in FIG. 4, respectively. While the chuck 13 is located in front of the back surface purging nozzle 15 in FIG. 5, the chuck 13 is indicated by two-dot chain lines for better visibility of the drawing. The tubular member 17 is not shown in FIG. 5 for the simplicity of the drawing. The back surface purging nozzle 15 is mounted such that the purge gas hits the back surface of the wafer W at an angle of 30 degrees, for example. Further, the back surface purging nozzle 15 is mounted in an inclined manner such that the clearance between the slit-like opening part 15$a$ and the back surface of the wafer W right above the opening part 15$a$ becomes wider as approaching the inward end (central end) Y. In other words, the back surface purging nozzle 15 is mounted such that the inner end (central end) Y is lower than the outer end (peripheral end) Z.

Assuming that the revolution speed of the wafer W is 3 rpm to 30 rpm, the distance from the back surface of the wafer W to the outer end Z is set at 3 mm to 4.5 mm and the distance from the back surface of the wafer W to the inner end Y is set at 6 mm to 9 mm. In a preferred example, the revolution speed of the wafer W is 10 rpm, the distance from the back surface of the wafer W to the outer end Z is 4 mm, and the distance from the back surface of the wafer W to the inner end Y is 8 mm.

Incidentally, if the revolution speed of the wafer W is set lower than 3 rpm, the drying takes a long time. If the revolution speed of the wafer W is set higher than 30 rpm, the transformation of the cleaning liquid into liquid drops and the falling of the liquid drops from the substrate are delayed by the effect of the centrifugal force, and thus the drying takes a long time also in this case.

Figure 6:
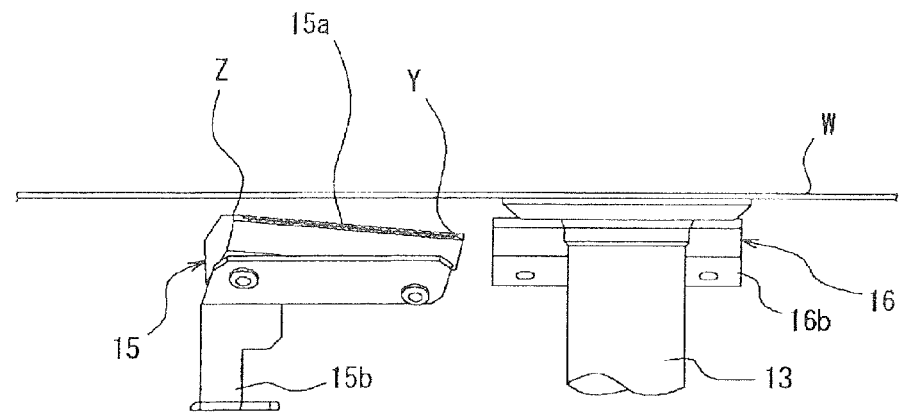
FIG. 6 is a side view of the back surface purging nozzle and the substrate periphery purging nozzle viewed in the direction of the arrow III in FIG. 4.
Figure 7:
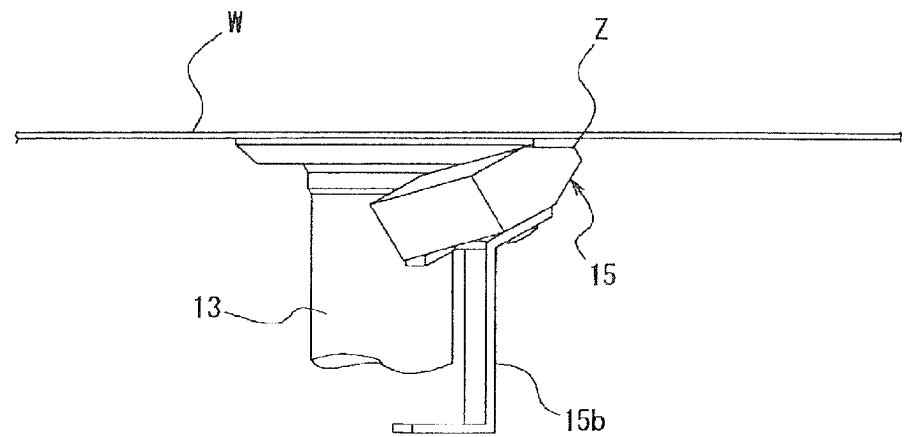
FIG. 7 is a side view of the back surface purging nozzle and the substrate periphery purging nozzle viewed in the direction of the arrow IV in FIG. 4.

As above, the slit-like opening part 15$a$ of the back surface purging nozzle 15 is arranged to have an angle $\theta$ with respect to a straight line in the radial direction of the wafer W in a plan view (as explained in detail referring to FIG. 4) and is also arranged in an inclined manner such that the inner end Y is lower than the outer end Z (as explained in detail referring to FIGS. 5 to 7). Due to the pressure distribution of the purge gas over the back surface of the wafer W caused by the arrangement, the cleaning liquid existing on the back surface of the wafer W is pushed inward while being pushed back in a direction against the rotation direction of the wafer W, gathers in the vicinity of the inner end Y, transforms into a large liquid drop, and falls from the wafer W.

Meanwhile, the cleaning liquid existing in the vicinity of the periphery of the back surface of the wafer W and moving outward due to the centrifugal force is pushed back toward the central side of the wafer W by the pressure of the purge gas discharged from the periphery purging nozzle 16. The cleaning liquid thus pushed back is captured in the purge gas flow from the back surface purging nozzle 15. Thereafter, similarly to the above-described movement, the cleaning liquid gathers in the vicinity of the inner end Y, transforms into a large liquid drop, and falls from the wafer W. Further, since the tubular member 17 is also discharging the purge gas outward and toward the back surface of the wafer W, the inward movement of the cleaning liquid beyond the vicinity of the inner end Y is suppressed. Accordingly, the gathering of the cleaning liquid around the inner end Y is promoted further so that the cleaning liquid surely falls from the wafer W in the form of liquid drops. Therefore, the drying time by the conventional wafer spin drying method (e.g., approximately 60 seconds at a wafer revolution speed of 1500 rpm) can be shortened to approximately 30 seconds at 10 rpm, by which the productivity is improved. Further, the occurrence of the defect shown in FIG. 2 in the vicinity of the notch part N due to the penetration of the cleaning liquid into the front surface can be prevented.

Figure 2:
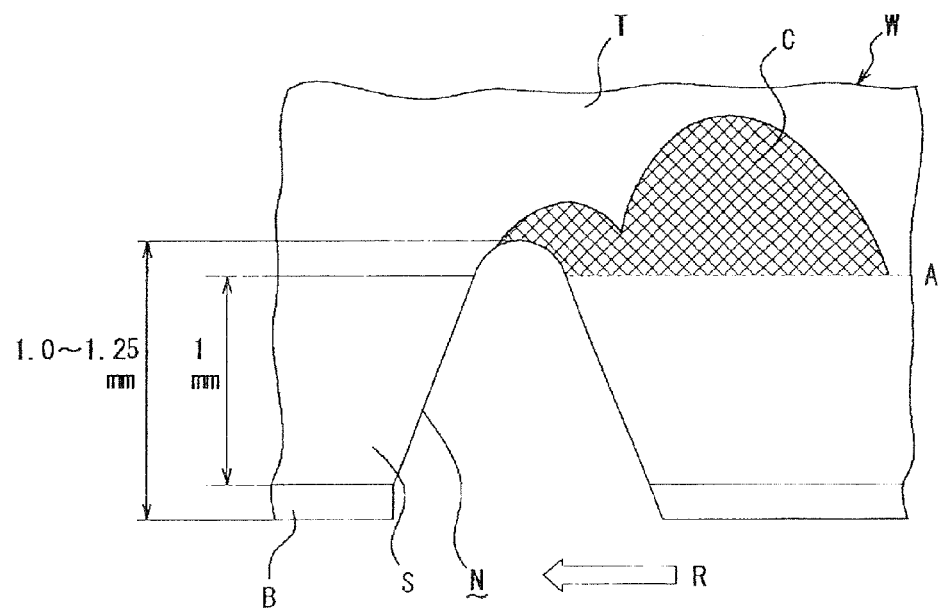
FIG. 2 is a plan view for explaining a defect in the vicinity of a notch part of a substrate.
Figure 8:
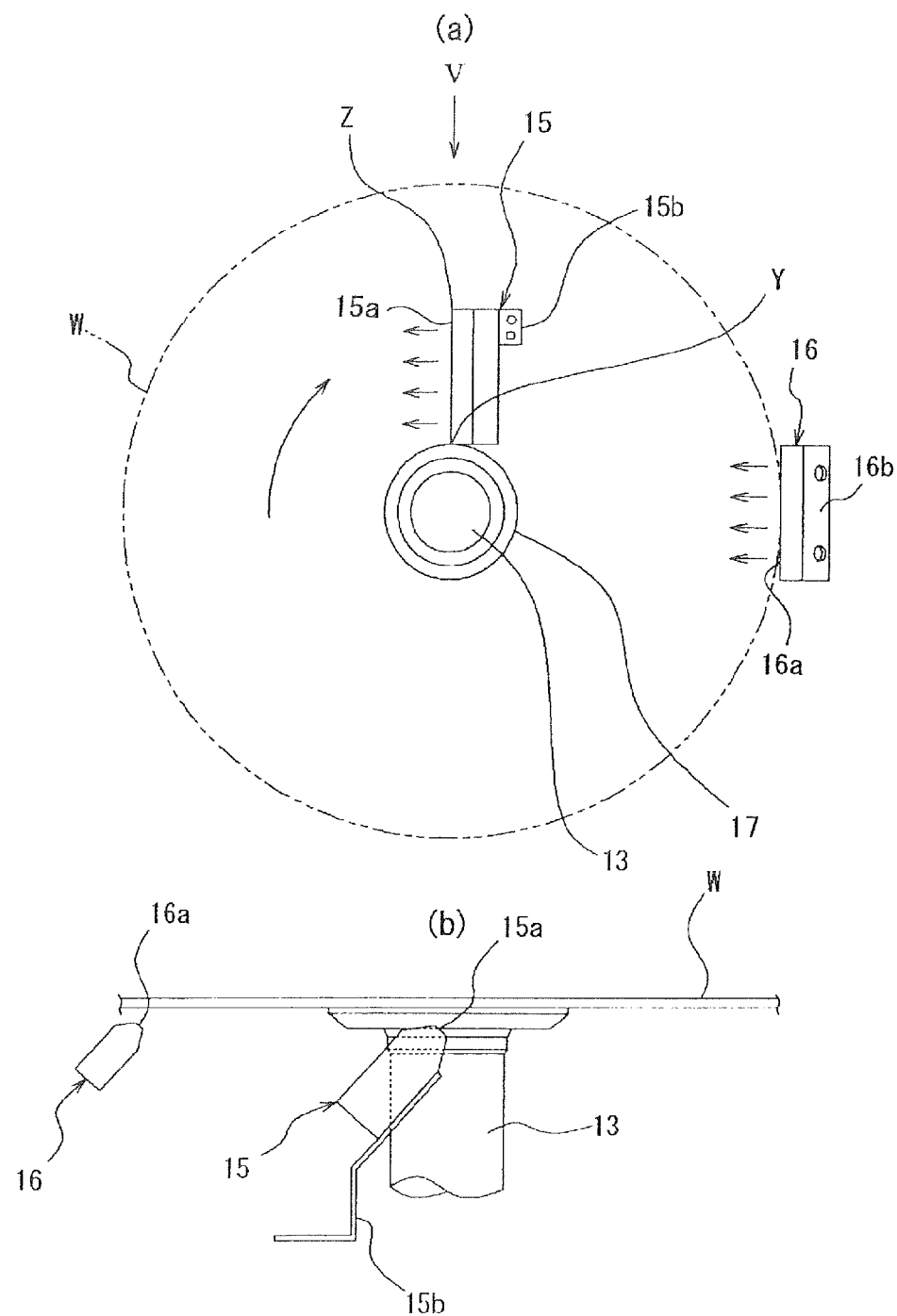
FIG. 8 is a schematic diagram showing another arrangement of the back surface purging nozzle and the substrate periphery purging nozzle, wherein (a) is a plan view, and (b) is a side view of the back surface purging nozzle and the substrate periphery purging nozzle viewed in the direction of the arrow V in (a).

The back surface purging nozzle 15 is not restricted to the arrangement shown in FIG. 2 in which the slit-like opening part 15$a$ is arranged an angle $\theta$ with respect to the straight line in the radial direction. The back surface purging nozzle 15 may also be arranged as shown in FIG. 8 in which the slit-like opening part 15$a$ extends along the straight line in the radial direction in a plan view, that is, the outer end Z and the inner end Y of the slit-like opening part 15$a$ are located on the same straight line extending in the radial direction. In other words, the angle $\theta$ in FIG. 2 may also be set at 0 (zero). The explanation of the periphery purging nozzle 16 is omitted here since it is the same as that described above. Also in this case, it is possible to make the cleaning liquid gather in the central side of the substrate and fall from the wafer W in the form of liquid drops by properly inclining the back surface purging nozzle 15 such that the distance from the back surface of the wafer W to the outer end Z is smaller than the distance from the back surface of the wafer W to the inner end Y and by properly controlling the revolution speed of the wafer W and the purge gas flow rate.

Not limited to the foregoing embodiment in which the discharge direction of the purge gas from the slit-like opening part 15$a$ of the back surface purging nozzle 15 is at an oblique angle (e.g., elevation angle of approximately 30 degrees) with respect to the back surface of the wafer W in FIG. 8($b$), the purge gas discharge direction of the slit-like opening part 15$a$ may be orthogonal to the back surface of the wafer W. Also in this case, the cleaning liquid can be made to gather in the central side of the substrate and fall from the substrate in the form of liquid drops.

Figure 9:
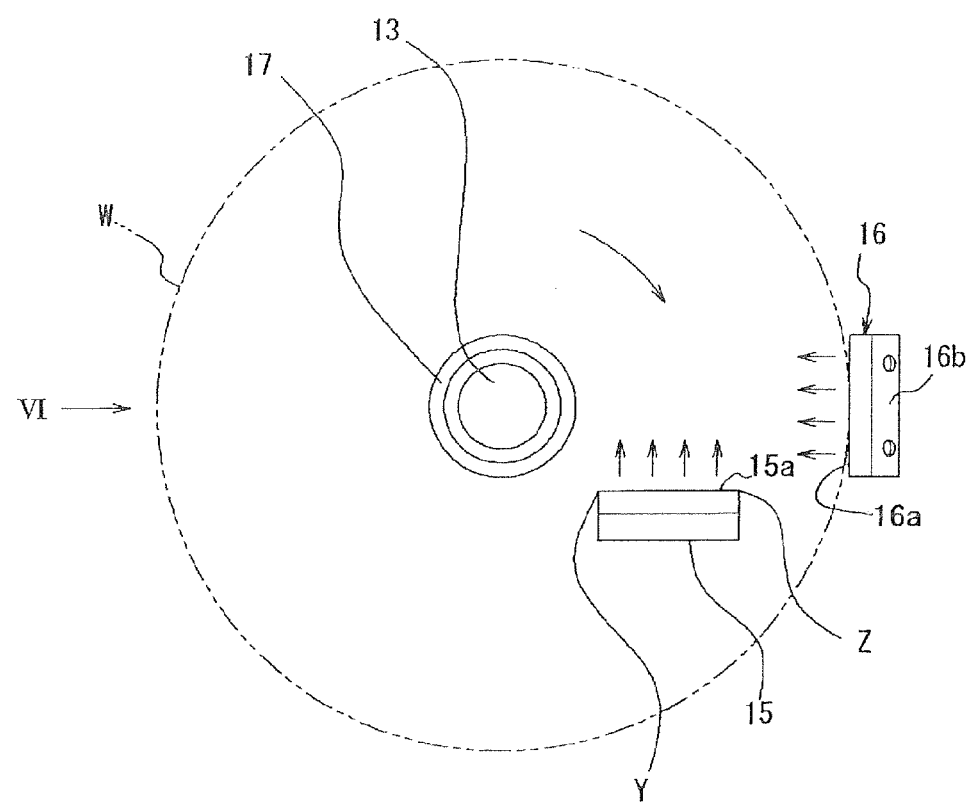
FIG. 9 is a schematic diagram showing still another arrangement of the back surface purging nozzle and the substrate periphery purging nozzle, wherein (a) is a plan view and (b) is a side view of the back surface purging nozzle and the substrate periphery purging nozzle viewed in the direction of the arrow VI in (a).
Figure 9:
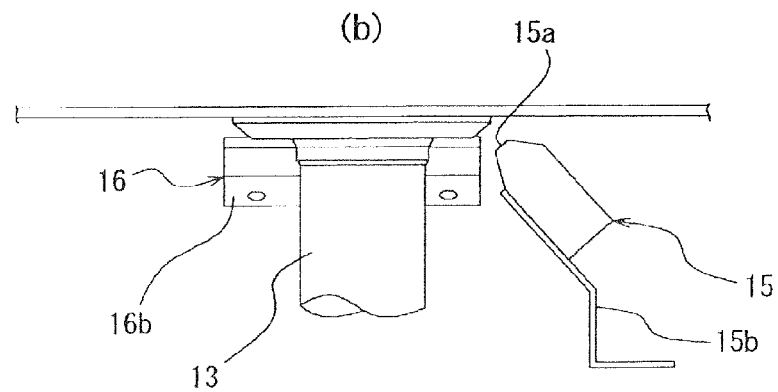
Figure 10:
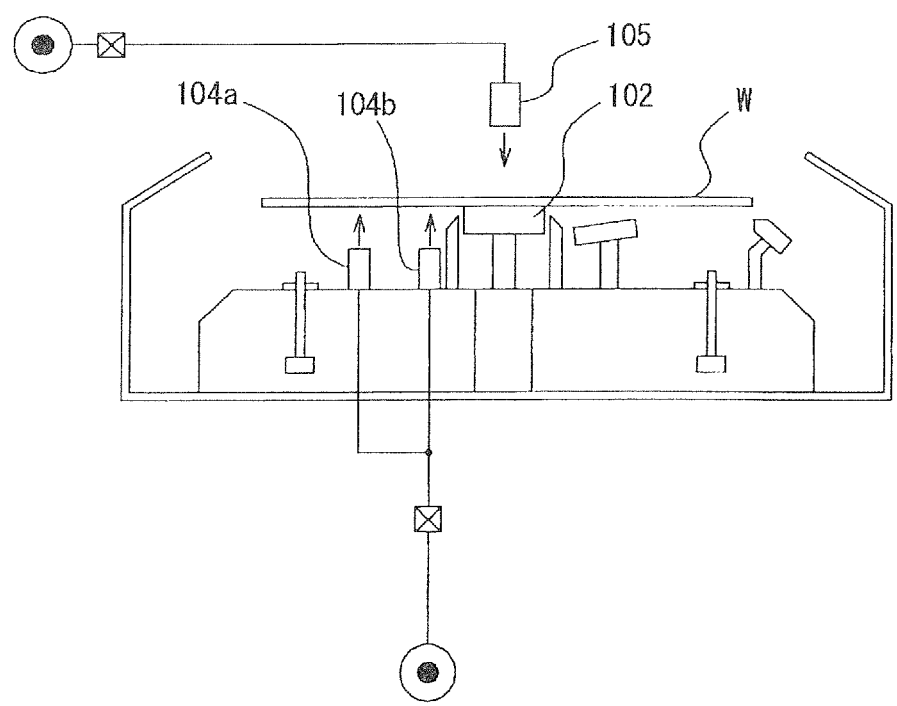
FIG. 10 is a vertical sectional view showing a conventional cleaning unit.

FIG. 9 shows still another arrangement of the back surface purging nozzle 15. The periphery purging nozzle 16 is arranged at the same position as in the above-described embodiments. In FIG. 9, the back surface purging nozzle 15 is located at a position advanced in the rotation direction of the wafer W from the region in front (inward in the radial direction) of the periphery purging nozzle 16. In the plan view, the purge gas discharge direction of the back surface purging nozzle 15 is orthogonal to that of the periphery purging nozzle 16. In this case, even if the revolution speed of the wafer W is set at 30 rpm, the cleaning liquid having been gathered by the periphery purging nozzle 16 toward the center of the wafer W is immediately captured in the purge gas flow from the back surface purging nozzle 15. Thereafter, the cleaning liquid gathers around the inner end Y, transforms into a liquid drop, and falls from the wafer W similarly to the above-described embodiments.

Figure 4:
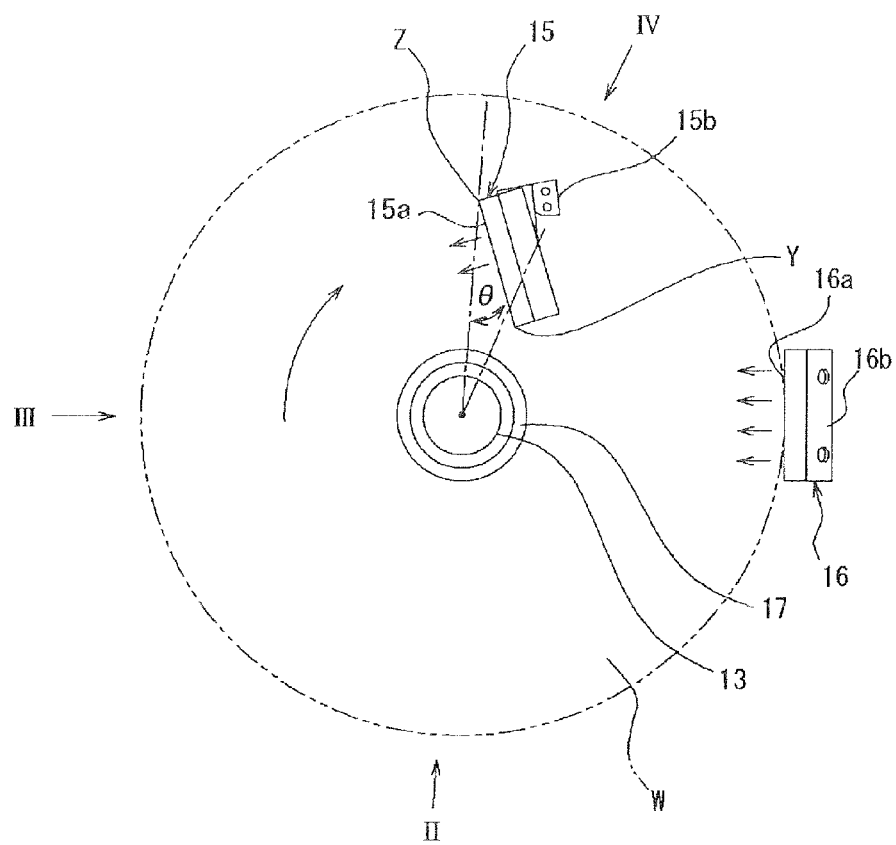
FIG. 4 is a plan view showing an arrangement of a back surface purging nozzle and a substrate periphery purging nozzle in the present invention.

In the embodiment of FIG. 4, the positional relationship between the back surface purging nozzle 15 and the periphery purging nozzle 16 in the plan view can be changed to that shown in FIG. 9. Also in this case, the cleaning liquid can be made to gather in the central side of the substrate and fall from the substrate in the form of liquid drops.

Next, an example of the flow of a process using the above-described substrate liquid treatment apparatus will be explained below. A wafer W is handed over to the cleaning unit 1 from the transfer arm and is held by the chuck 13 by suctioning. Subsequently, a cleaning treatment is performed by supplying a treatment liquid to the front surface of the wafer W while rotating the wafer W. In the middle of the cleaning treatment, the back surface cleaning is performed for a prescribed period by supplying the cleaning liquid to the back surface of the wafer W. Subsequently, a step for drying the cleaning liquid adhering to the back surface of the wafer W is performed. In this step, the revolution speed of the wafer W is adjusted to 10 rpm, for example, by controlling the rotary drive motor M and the cleaning liquid existing in the peripheral part of the wafer W is blown toward the center of the wafer W by opening the periphery purge gas on/off valve V4 to have the periphery purging nozzle 16 discharge the purge gas at a discharge rate of 30 L/min. At the same time as the start of the purge gas discharge from the periphery purging nozzle 16 or after the elapse of a prescribed period since the start, the back surface purge gas on/off valve V3 is opened to have the back surface purging nozzle 15 blow out the purge gas at a rate of 50 L/min. In this case, it is also possible to open the tubular member purge gas on/off valve V5 to have the tubular member 17 blow out the purge gas against the wafer W at a rate of 50 L/min. By maintaining this state for 30 seconds, for example, almost all of the cleaning liquid adhering to the back surface of the wafer W transforms into liquid drops and falls into the cup 11 in the first 15 seconds and the back surface can be dried out with the purge gas in the remaining 15 seconds.

In the foregoing embodiments, the substrate liquid treatment apparatus is implemented as a cleaning treatment unit for performing the cleaning treatment on the front surface of the substrate with a treatment liquid. However, the substrate liquid treatment apparatus is not limited to such a cleaning treatment unit. The substrate liquid treatment apparatus may also be implemented as a coating unit for forming a film (e.g., resist film) on a substrate, a developing unit for performing the development treatment after the exposure, a liquid treatment unit for performing a liquid treatment on a surface of an FPD substrate, an adhesive agent coating unit installed in a wafer bonding apparatus, and so forth. Also in these units, the cleaning liquid adhering to the back surface of the substrate can be dried by using the purge nozzles described above.

The invention claimed is:

1. A substrate liquid treatment apparatus that supplies a cleaning liquid to a back surface of a substrate to perform a cleaning treatment, said apparatus comprising:
   a substrate holding unit that horizontally holds the substrate at a central part of the back surface of the substrate;
   a rotary drive mechanism that rotates the substrate holding unit around a vertical axis;
   a back surface purging nozzle that discharges a purge gas onto the back surface of the substrate that is rotating while being held by the substrate holding unit;
   a periphery purging nozzle that discharges the purge gas onto the back surface of the substrate that is rotating while being held by the substrate holding unit;
   a purge gas supplying mechanism that supplies the purge gas to the back surface purging nozzle and the periphery purging nozzle; and
   a control unit that controls the rotary drive mechanism and the purge gas supplying mechanism,
   wherein the back surface purging nozzle has a slit opening part extending from a central side to a peripheral side of the substrate in a plan view, and wherein vertical distance between the slit opening part and the substrate held by the substrate holding unit increases as approaching an end of the slit opening part on the central side of the substrate,
   wherein the periphery purging nozzle is installed such that the periphery purging nozzle discharges the purge gas toward a region on the back surface of the substrate, which region is located radially outside an end of the slit opening part of the back surface purging nozzle and radially inside an peripheral edge of the substrate, and such that the purge gas is directed toward a central part of the substrate, and
   wherein the control unit controls the rotary drive mechanism and the purge gas supplying mechanism such that, after supplying of the cleaning liquid to the substrate is stopped, the back surface purging nozzle and the periphery purging nozzle discharge the purge gas toward the back surface of the substrate while rotating the substrate having the cleaning liquid adhering thereto.

2. The substrate liquid treatment apparatus according to claim 1, wherein the slit opening part has a length not less than ¼ of the radius of the substrate.

3. The substrate liquid treatment apparatus according to claim 1, wherein the control unit controls the rotary drive mechanism so that revolution speed of the substrate is from 3 rpm to 30 rpm.

4. The substrate liquid treatment apparatus according to claim 1, wherein:
   the end of the slit opening part of the back surface purging nozzle on the peripheral side of the substrate is located on a straight line extending in a radial direction of the substrate held by the substrate holding unit in a plan view, and
   the end of the slit opening part on the central side of the substrate is located on the straight line extending in the radial direction or at a position advanced in a rotation direction of the substrate from the straight line extending in the radial direction.

5. The substrate liquid treatment apparatus according to claim 1, wherein the back surface purging nozzle is arranged to discharge the purge gas so that the purge gas is incident obliquely on the back surface of the substrate in a direction against the rotation direction of the substrate.

6. The substrate liquid treatment apparatus according to claim 1, wherein the vertical distance between the slit opening part and the substrate held by the substrate holding unit measured at the end of the slit opening part on the central side of the substrate is approximately twice the vertical distance measured at the end of the slit opening part on the peripheral side of the substrate.

7. The substrate liquid treatment apparatus according to claim 1, wherein the periphery purging nozzle has a slit opening part extending in a tangential direction of the periphery of the substrate.

8. The substrate liquid treatment apparatus according to claim 1, wherein the periphery purging nozzle is arranged to discharge the purge gas toward a position spaced radially inwardly apart from the peripheral edge of the substrate at a distance within a range of from 2 mm to 10 mm.

9. The substrate liquid treatment apparatus according to claim 1, wherein the back surface purging nozzle is configured to discharge a gas orthogonally onto a straight line extending on the back surface in a radial direction of the substrate.

10. The substrate liquid treatment apparatus according to claim 1, further comprising a tubular member surrounding the substrate holding unit, wherein the tubular member is arranged such that a small clearance is formed between an upper end of the tubular member and the back surface of the substrate held by the substrate holding unit.

11. The substrate liquid treatment apparatus according to claim 10, wherein the tubular member has an inclined surface extending obliquely downward from the upper end so as to lower toward outside, and wherein gas discharging ports are formed along the circumference of the inclined surface to discharge a gas onto the back surface of the substrate.

12. A substrate liquid treatment method that performs a liquid treatment that treats a surface of a substrate by supplying a treatment liquid to the surface or a brush cleaning treatment that cleans a substrate with a brush and also performs a cleaning treatment that cleans a back surface of a substrate by supplying a cleaning liquid to the back surface, said method comprising:
   rotating the substrate by means of a substrate holding unit holding the substrate at a central part of the back surface of the substrate, with the supplying of the cleaning liquid to the back surface being stopped and with the cleaning liquid adhering to the back surface; and
   performing back surface purging by discharging from a back surface purging nozzle a purge gas toward the back surface of the substrate and by discharging a purge gas from a periphery purging nozzle toward the back surface of the substrate,
   wherein the back surface purging nozzle has a slit opening part extending from a central side to a peripheral side of the substrate in a plan view, and wherein vertical distance between the slit opening part and the substrate held by the substrate holding unit increases as approaching an end of the slit opening part on the central side of the substrate,
   wherein the periphery purging nozzle discharges the purge gas toward a region on the back surface of the substrate, which region is located radially outside an end of the slit opening part of the back surface purging nozzle and radially inside an peripheral edge of the substrate, such that the purge gas is directed toward a central part of the substrate, and
   the back surface purging and the substrate periphery purging are started after the supplying of the cleaning liquid is stopped.

13. The substrate liquid treatment method according to claim 12, wherein the slit opening part has a length not less than ¼ of the radius of the substrate.

14. The substrate liquid treatment method according to claim 12, wherein revolution speed of the substrate is from 3 rpm to 30 rpm.

15. The substrate liquid treatment method according to claim 12, wherein a tubular member surrounding the substrate holding unit is arranged such that a small clearance is formed between an upper end of the tubular member and the back surface of the substrate held by the substrate holding unit, so that entry of the cleaning liquid into the substrate holding unit is blocked by the tubular member.

16. The substrate liquid treatment method according to claim 15, wherein the tubular member has an inclined surface extending obliquely downward from the upper end so as to lower toward outside, and wherein gas discharging ports are formed along the circumference of the inclined surface for discharging a gas onto the back surface of the substrate, and wherein a purge gas is discharged from the gas discharging ports while the back surface purging is being performed.

* * * * *